United States Patent
Pi et al.

(10) Patent No.: US 10,020,525 B2
(45) Date of Patent: Jul. 10, 2018

(54) METHOD AND SYSTEM FOR DIAGNOSING STATE OF FUEL CELL STACK

(71) Applicant: HYUNDAI MOTOR COMPANY, Seoul (KR)

(72) Inventors: Hyun Young Pi, Yongin-si (KR); Kwi Seong Jeong, Yongin-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 237 days.

(21) Appl. No.: 15/165,888

(22) Filed: May 26, 2016

(65) Prior Publication Data

US 2017/0170500 A1   Jun. 15, 2017

(30) Foreign Application Priority Data

Dec. 9, 2015 (KR) .................. 10-2015-0174746

(51) Int. Cl.
| | |
|---|---|
| *H01M 8/04664* | (2016.01) |
| *G01R 31/36* | (2006.01) |
| *H01M 8/04537* | (2016.01) |
| *H01M 8/1004* | (2016.01) |
| *H01M 8/04492* | (2016.01) |
| *H01M 8/04746* | (2016.01) |
| *H01M 8/1018* | (2016.01) |

(52) U.S. Cl.
CPC .... *H01M 8/04679* (2013.01); *G01R 31/3662* (2013.01); *G01R 31/3679* (2013.01); *H01M 8/04529* (2013.01); *H01M 8/04559* (2013.01); *H01M 8/04589* (2013.01); *H01M 8/04649* (2013.01); *H01M 8/04753* (2013.01); *H01M 8/1004* (2013.01); *H01M 2008/1095* (2013.01)

(58) Field of Classification Search
CPC ............... H01M 8/04634; H01M 8/04649
See application file for complete search history.

(56) References Cited

FOREIGN PATENT DOCUMENTS

| | | |
|---|---|---|
| JP | 2007-012420 A | 1/2007 |
| JP | 2010-218876 A | 9/2010 |
| JP | 2013-125604 A | 6/2013 |
| JP | 2013-191362 A | 9/2013 |
| JP | 2013-258043 A | 12/2013 |
| KR | 10-2008-0018217 A | 2/2008 |
| KR | 10-2010-0121354 A | 11/2010 |
| KR | 10-2014-0080287 A | 6/2014 |

OTHER PUBLICATIONS

Korean Office Action dated Nov. 14, 2016, issued in Korean patent application No. 10-2015-0174746.

*Primary Examiner* — Olatunji Godo
(74) *Attorney, Agent, or Firm* — McDermott Will & Emery LLP

(57) ABSTRACT

A method for diagnosing a state of a fuel cell stack as being contaminated includes measuring an impedance of a fuel cell stack at a predetermined low frequency and a predetermined high frequency, increasing an amount of fuel or oxidizer supplied to the fuel cell stack when the impedance at the predetermined high frequency is lower than a first critical point and the impedance at the predetermined low frequency is higher than a second critical point, remeasuring the impedance of the fuel cell stack at the predetermined low frequency, and determining that the fuel cell stack is contaminated when the impedance at the predetermined low frequency that is measured in the remeasuring step is higher than the second critical point.

10 Claims, 6 Drawing Sheets

METHOD AND SYSTEM FOR DIAGNOSING STATE OF FUEL CELL STACK

CROSS REFERENCE TO RELATED APPLICATION

The present application claims the benefit of priority to Korean Patent Application No. 10-2015-0174746, filed Dec. 9, 2015 with the Korean Intellectual Property Office, the entire contents of which is incorporated herein for all purposes by this reference.

TECHNICAL FIELD

The present disclosure relates to a technology for detecting contamination of a fuel cell and, more particularly, to a method and system for diagnosing a state of a fuel cell stack as being contaminated by measuring impedance of a fuel cell stack at a high frequency and a low frequency.

BACKGROUND

A fuel cell system is a power generation system that directly converts chemical energy of a fuel into electricity. A fuel cell system includes a fuel cell stack that generates electricity, a fuel supply unit that supplies the fuel cell stack with fuel (i.e. hydrogen), an air supply unit that supplies the fuel cell stack with air (i.e. oxygen) serving as an oxidant that is needed to cause an electrochemical reaction, and a heat-and-water management unit that discharges heat out of the fuel cell stack and controls the operation temperature of the fuel cell stack. A fuel cell stack produces electricity through an electrochemical reaction between hydrogen (fuel) and oxygen (air) and also generates byproducts (heat and water) that need to be discharged out of the fuel cell stack.

A fuel cell stack that is suitably used for a fuel cell vehicle includes many single cells arranged in a row. Each single cell includes a membrane-electrode assembly (MEA) disposed in the center. An MEA includes an electrolyte membrane that allows protons to pass therethrough. Catalyst layers serving as a cathode and an anode at which hydrogen and oxygen react with each other are provided on respective surfaces of the electrolyte membrane. Gas diffusion layers (GDL) are disposed on the surfaces of the catalyst layers. Separators with respective flow fields (channels) through which fuel and air are supplied to the anode and the cathode are disposed on the surfaces of the GDLs. End plates are disposed at respective ends of a single cell to firmly combine the all elements.

In a fuel cell stack, hydrogen and oxygen are ionized through chemical reactions by catalyst layers. Then, an oxidation reaction occurs to generate protons (hydrogen ions) and electrons at a fuel electrode to which hydrogen is supplied, and a reduction reaction involving hydrogen ions and oxygen ions occurs to produce water at an air electrode to which air is supplied. A typical electrode catalyst that is used for a fuel cell is composed of a catalyst support made from a carbon material and a cocatalyst such as Ru, Co, Cu, or the like. Hydrogen is supplied to an anode (also referred to as "oxidation electrode") and oxygen (air) is supplied to a cathode (also referred to as "reduction electrode"). Hydrogen supplied to an anode is split into protons $H^+$ and electrons $e^-$ by catalysts on electrode layers disposed on respective surfaces of an electrolyte membrane. Of the protons and electrons, only protons can selectively pass through an electrolyte membrane called a proton exchange membrane and can reach a cathode, and electrons move through GDLs (conductive layers) and separators to reach the cathode.

Hydrogen ions that reach the cathode through the electrolyte membrane and electrons that reach the cathode through the separators combine with oxygen contained in air that is supplied to the cathode by an air supply unit, thereby producing water. At this point, movement of hydrogen ions induces an electric current that flows along an external wire, and heat, aside from the water, is also concomitantly produced as a byproduct.

As for a fuel cell system, a fuel cell stack deteriorates in performance thereof due to a variety of causes. Therefore, a technology for determining the causes of deterioration in performance of a fuel cell stack is needed. Potential causes of the deterioration in the performance of a fuel cell stack include flooding, drying, and contamination of the fuel cell stack.

For example, when the cause of deterioration in performance of a fuel cell stack is falsely determined as flooding when the actual cause is contamination of a fuel cell stack, an operation control of increasing a flow rate of air is performed to solve the problem of flooding, which aggravates dryness of a fuel cell stack. That is, an appropriate measure is not taken, thus failing to solve the problem of the fuel cell stack, and possibly creating new problems. Therefore, it is important to accurately and precisely diagnose a state of a fuel cell stack to determine the causes of deterioration in performance of a fuel cell stack so that appropriate measures to solve a problem of the fuel cell stack can be taken when a problem occurs in a fuel cell system.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems occurring in the related art, and the present disclosure is intended to propose a method and system for diagnosing a state of a fuel cell stack to determine a cause of deterioration in performance of a fuel cell stack by measuring impedance of a fuel cell stack at a high frequency and a low frequency.

In order to achieve the above object, according to one aspect of the present disclosure, there is provided a method for diagnosing a state of a fuel cell stack as being contaminated, the method including: measuring impedance of a fuel cell stack at a predetermined low frequency and a predetermined high frequency; increasing an amount of fuel or oxidizer supplied to the fuel cell stack when the impedance at the predetermined high frequency is lower than a first critical point and the impedance at the predetermined low frequency is higher than a second critical point; remeasuring impedance of the fuel cell stack at the predetermined low frequency; and determining that the fuel cell stack is contaminated when the impedance at the predetermined low frequency that is measured in the remeasuring is higher than the second critical point.

The method may further include determining that the fuel cell stack is dried out when the impedance at the predetermined high frequency that is measured in the measuring is higher than the first critical point.

The method may further include determining that the fuel cell stack is normal when the impedance at the predetermined high frequency that is measured in the measuring is lower than the first critical point and the impedance at the predetermined low frequency that is measured in the measuring is lower than the second critical point.

The method may further include determining that the fuel cell stack is flooded when the impedance at the predetermined low frequency that is measured in the remeasuring is lower than the second critical point.

In order to achieve the object of the disclosure, according to another aspect, there is provided a method for diagnosing a state of a fuel cell stack as being contaminated, the method including: measuring impedance of a fuel cell stack at a predetermined low frequency and a predetermined high frequency; increasing an amount of fuel or oxidizer supplied to the fuel cell stack when the impedance at the predetermined high frequency that is measured in the measuring of the impedance is lower than a first critical point and the impedance at the predetermined low frequency that is measured in the measuring of the impedance is higher than a second critical point; measuring an output voltage of the fuel cell stack; and determining that the fuel cell stack is contaminated when the output voltage measured in the measuring of the output voltage is not increased from an output voltage of the fuel cell stack that is output immediately before the measuring of the impedance is performed, by a predetermined critical voltage level.

The method may further include determining that the fuel cell stack is dried out when the impedance at the predetermined high frequency that is measured in the measuring of the impedance is higher than the first critical point.

The method may further include determining that the fuel cell stack is normal when the impedance at the predetermined high frequency that is measured in the measuring of the impedance is lower than the first critical point and the impedance at the predetermined low frequency is lower than the second critical point.

The method may further include determining that the fuel cell stack is flooded when the output voltage that is measured in the measuring of the output voltage is increased from the output voltage of the fuel cell stack that is output immediately before the measuring of the impedance is performed, by the predetermined critical voltage level In order to achieve the object of the disclosure, according to a further aspect, there is provided a system for diagnosing a state of a fuel cell stack as being contaminated, the system including: an impedance meter that measures impedance of a fuel cell stack at a predetermined high frequency and a predetermined low frequency; and a controller that diagnoses a state of the fuel cell stack according the impedance of the fuel cell stack at the predetermined high frequency and the impedance of the fuel cell stack at the predetermined low frequency, the impedances being measured by the impedance meter, wherein the controller receives the impedance at the predetermined high frequency and the impedance at the predetermined low frequency, the impedances being measured by the impedance meter; the controller performs an operation control of increasing an amount of fuel or oxidizer supplied to the fuel cell stack when the impedance at the predetermined high frequency is lower than a first critical point and the impedance at the predetermined low frequency is higher than a second critical point; the controller receives the impedance of the fuel cell stack at the predetermined low frequency after performing the operation control of increasing the amount of fuel or oxidizer supplied to the fuel cell stack, and the controller determines that the fuel cell stack is contaminated when the remeasured impedance at the predetermined low frequency is higher than the second critical point.

In order to achieve the object of the disclosure, according to a further aspect, there is provided a system for diagnosing a state of a fuel cell stack as being contaminated, the system including: an impedance meter that measures impedance of a fuel cell stack at a predetermined high frequency and a predetermined low frequency; and a controller that diagnoses a state of the fuel cell stack according to the impedance at the predetermined high frequency and the impedance at the predetermined low frequency, wherein the controller receives the impedance at the predetermined high frequency and the impedance at the predetermined low frequency, the impedances being measured by the impedance meter; the controller performs an operation control of increasing an amount of fuel or oxidizer supplied to the fuel cell stack when the impedance at the predetermined high frequency is lower than a first critical point and the impedance at the predetermined low frequency is higher than a second critical point; the controller receives an output voltage of the fuel cell stack that is measured by a voltmeter after performing the operation control of increasing the amount of fuel or oxidizer supplied to the fuel cell stack; and the controller determines that the fuel cell stack is contaminated when the output voltage measured is not increased by a predetermined critical voltage level from an output voltage of the fuel cell stack that is measured by the voltmeter immediately before the impedance at the predetermined high frequency and the impedance at the predetermined low frequency are measured.

The method and system for diagnosing a fuel cell stack as being contaminated according to the present disclosure has the following advantages.

When operation performance of a fuel cell stack is deteriorated, it is possible to precisely and accurately determine a cause of deterioration in performance of the fuel cell stack especially when the deterioration is attributable to contamination of the fuel cell stack, thereby enabling an operator to promptly take an appropriate measure to solve the problem.

In addition, it is possible to prevent a fuel cell stack from undergoing unfavorable conditions attributable to inappropriate measures that may be taken after inaccurate diagnosis of problems of a fuel cell stack is made. For example, there may be a case that a fuel cell stack suffers flooding but a diagnosis of the problem of the fuel cell stack is falsely determined as drying. In this case, an operation control of decreasing a flow rate of air supplied to the fuel cell stack is performed. This aggravates flooding of the fuel cell stack, thereby deteriorating stability and durability of the fuel cell stack. Conversely, there may be a case that a fuel cell stack suffers drying but the fuel cell stack is falsely diagnosed with flooding. In this case, an operation control of increasing a flow rate of air supplied to the fuel cell stack may be performed. This intensifies dryness of the fuel cell stack, thereby continuously deteriorating operation performance of the fuel cell stack.

DETAILED DESCRIPTION

Hereinbelow, a method and system for diagnosing a state of a fuel cell stack as being contaminated according to preferred embodiments of the present disclosure will be described with reference to the accompanying drawings.

Figure 1:
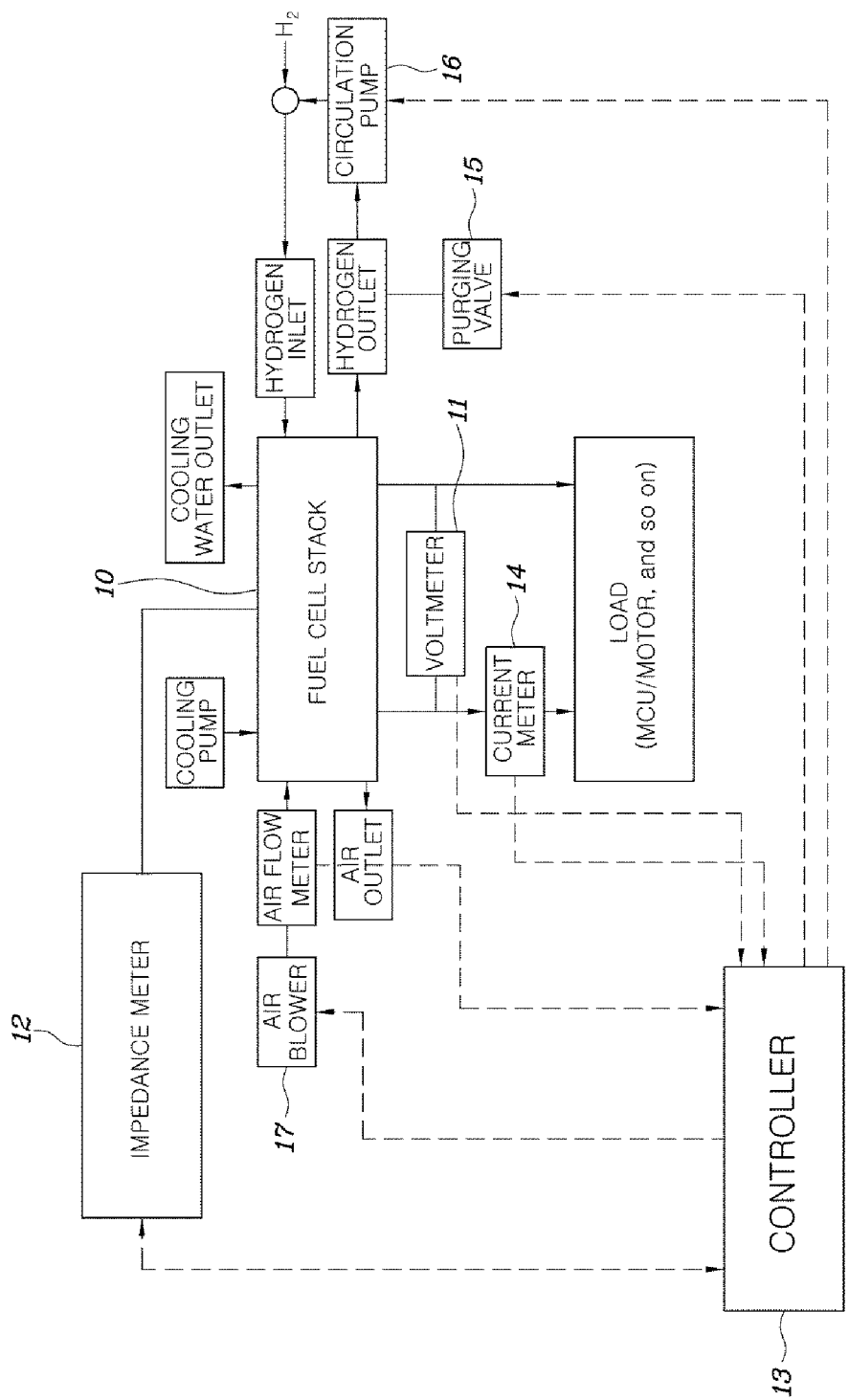
FIG. 1 is a block diagram illustrating a system for diagnosing a state of a fuel cell stack as being contaminated according to an embodiment of the present disclosure.

FIG. 1 is a block diagram illustrating a system for diagnosing a state of a fuel cell stack as being contaminated according to one embodiment of the present disclosure.

With reference to FIG. 1, the diagnosing system may include a fuel cell stack 10, a voltmeter 11 that detects an output voltage of the fuel cell stack 10, a impedance meter 12 that measures impedance of the fuel cell stack 10, and a controller 13 that receives information of the impedance and voltage of the fuel cell stack 10 and determines a state of the fuel cell stack 10.

The fuel cell stack 10 may be an element that produces electricity through an oxidation-reduction reaction of oxygen and hydrogen.

The fuel cell stack 10 may include a plurality of single cells that are stacked in series. Each single cell may include a membrane electrode assembly and separators. The membrane electrode assembly may be made up of an electrolyte membrane, catalyst layers, and gas diffusion layers. The separators may be disposed on the surfaces of the respective gas diffusion layers and may be provided with flow fields through which fuel and air are supplied to a cathode and an anode and through which water (produced as a byproduct) may be discharged out of the fuel cell stack.

Hydrogen and oxygen are ionized through chemical reactions of the catalyst layers. Then, an oxidation reaction occurs to generate protons (hydrogen ions) and electrons at an electrode to which hydrogen is supplied, and a reduction reaction involving hydrogen ions and oxygen ions occurs to produce water at an electrode to which air is supplied. A typical electrode catalyst used for a fuel cell is composed of a catalyst support made from a carbon material and a cocatalyst such as Ru, Co, Cu, or the like. Hydrogen is supplied to the anode and oxygen (air) is supplied to the cathode. Hydrogen supplied to an anode is split into protons and electrons $e^-$ by catalysts on electrode layers disposed on the respective surfaces of an electrolyte membrane. Of the protons and electrons, only protons can selectively pass through the electrolyte membrane, called a proton exchange membrane, to reach the cathode. While the protons are moving through the electrolyte membrane, electrons move through the gas diffusion layers (conductive layers) and separators to reach the cathode.

Hydrogen ions that reach the cathode through the electrolyte membrane and electrons that reach the cathode through the separators combine with oxygen contained in air that is supplied to the cathode by an air supply unit, thereby producing water. At this point, movement of hydrogen ions induces an electric current that flows along an external wire and heat, aside from the water, is concomitantly produced as a byproduct.

The diagnosing system according to a present embodiment may be a system for detecting contamination of the catalyst layers of a single cell that constitute the fuel cell stack 10.

The impedance meter 12 may be an element that measures impedance of the fuel cell stack 10. The impedance meter 12 may be configured in various ways. For example, the impedance meter 12 may apply a voltage signal or current signal with a predetermined frequency to a single cell, a single cell group including a predetermined number of single cells, or all the single cells in the fuel cell stack 10, detect a current or a voltage of the fuel cell stack 10 at the predetermined frequency, and compute impedance for each frequency component.

According to a present embodiment, the impedance measured by the impedance meter 12 may include high frequency impedance that is impedance of the fuel cell stack when a voltage or current signal of a predetermined high frequency is applied and low frequency impedance that is impedance of the fuel cell stack when a voltage or current signal of a predetermined low frequency is applied. The frequencies of the voltage signal used for measurement of the high frequency impedance and the low frequency impedance may vary according to the specifications of the fuel cell stack. For example, the high frequency may be 1000 Hz or higher and the low frequency may be 10 Hz or lower.

The impedance meter 12 may be operated according to the control of the controller 13.

The controller 13 may control overall operation of a fuel cell system. According to a present embodiment, the controller may compute information that is needed to determine contamination of the fuel cell stack 10 using the information provided by the voltmeter 11 and the impedance meter 12, and may control other elements in a fuel cell system as necessary.

The controller 13 may determine a variety of states of the fuel cell stack according to the high frequency impedance and the low frequency impedance measured by the impedance meter 12, the output voltage of the fuel cell stack 10 measured by the voltmeter 11, and changes thereof.

Hereinafter, a method for diagnosing a state of a fuel cell stack as being contaminated, which is executed in the diagnosing system which has been described above, will be described. Operation of the diagnosing system will be more clearly understood with reference to the diagnosing method described below.

Figure 2:
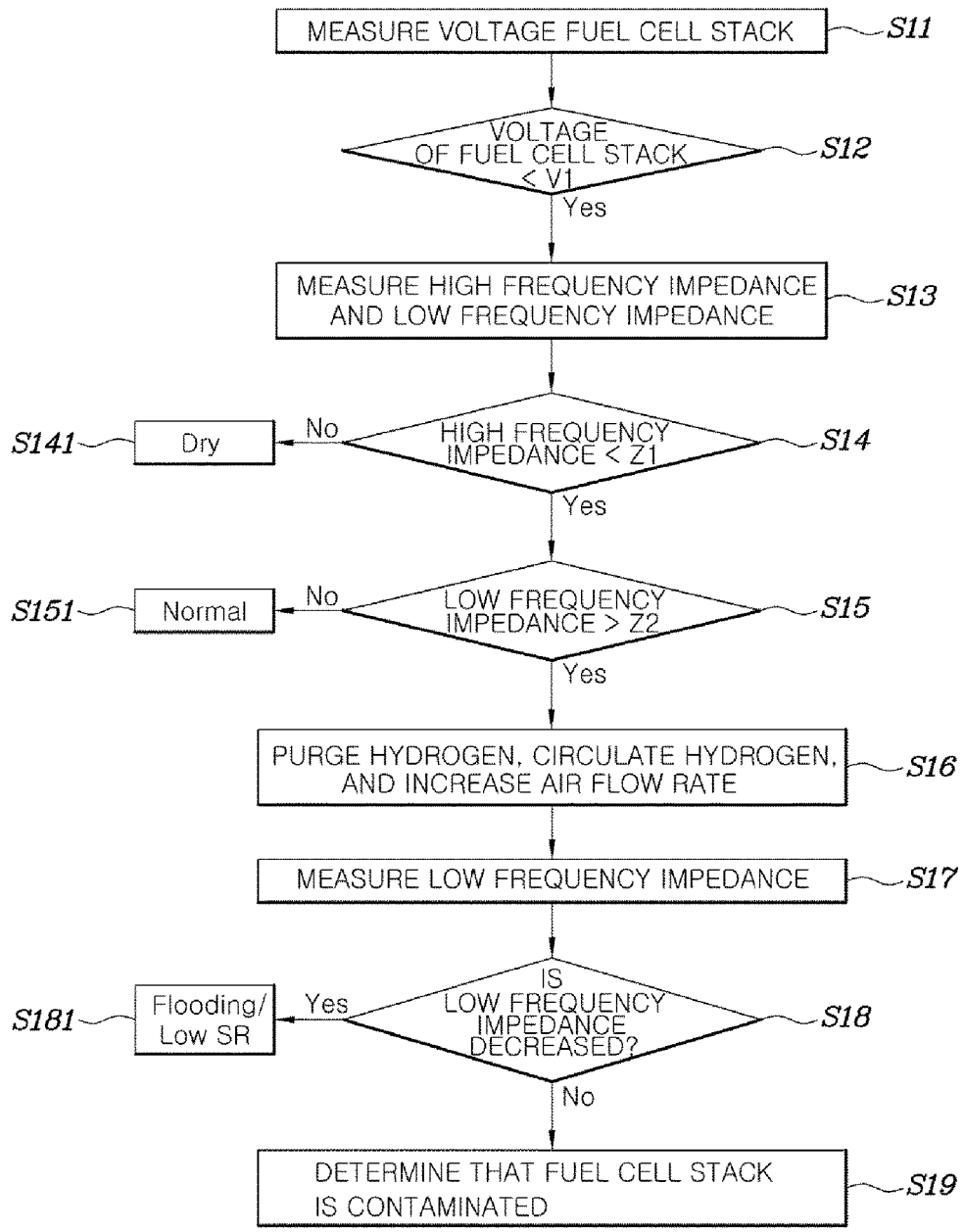
FIGS. 2 and 3 are flowcharts illustrating a method for diagnosing a state of a fuel cell stack as being contaminated according to embodiments of the present disclosure.
Figure 3:
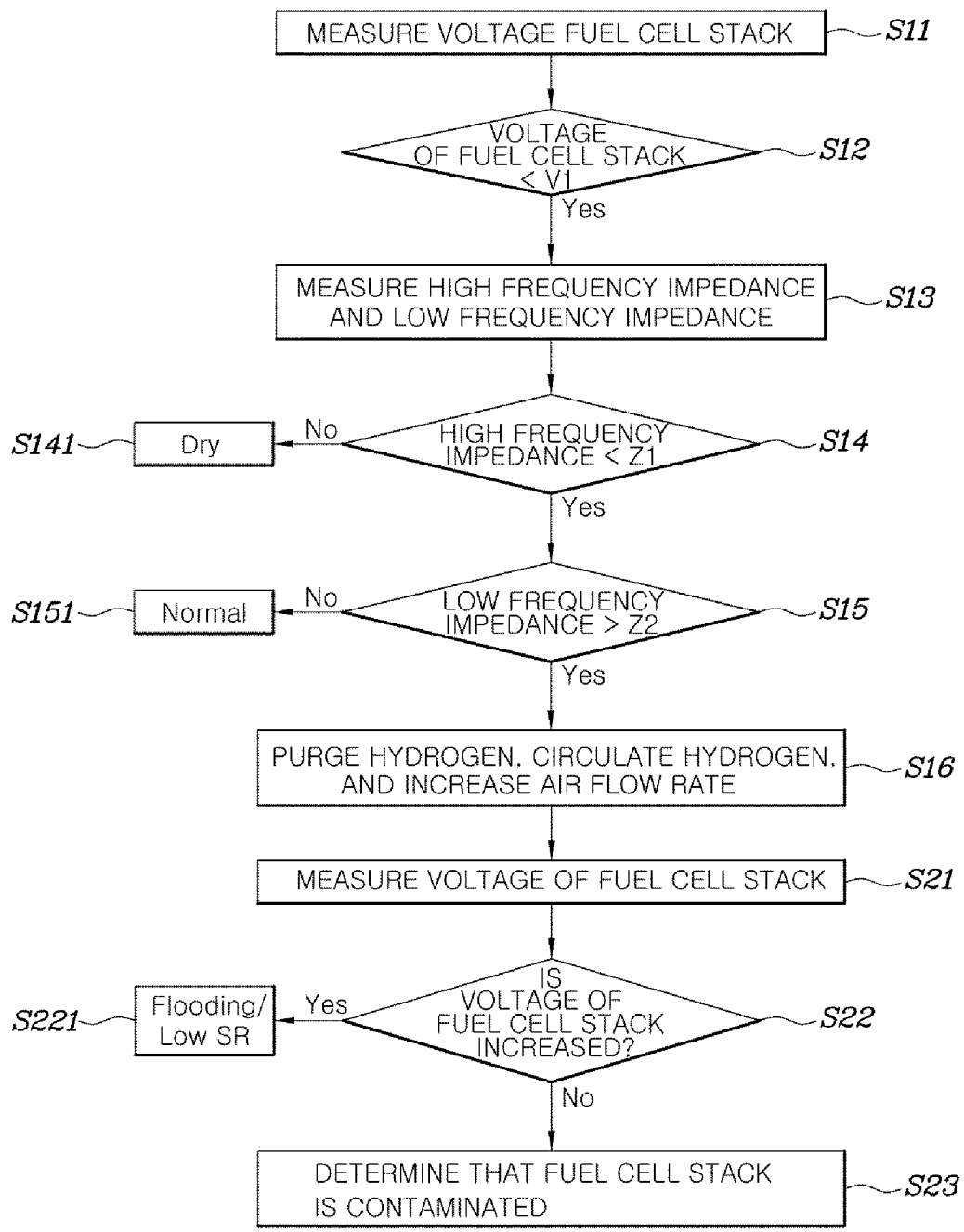

FIGS. 2 and 3 are flowcharts illustrating a method for diagnosing a state of a fuel cell stack as being contaminated according to embodiments of the present disclosure.

First, the controller 13 may receive an output voltage of the fuel cell stack 10 from the voltmeter 11 at Step S11 and may determine whether it is necessary to diagnose a state of the fuel cell stack 10 according to the received output voltage of the fuel cell stack 10 at Step S12. The controller 13 may be further provided with a current measured by a current meter 14 that measures a current supplied to a load from an output terminal of the fuel cell stack 10. That is, the controller 13 may receive the output voltage and current of the fuel cell stack 10 and determine whether the output voltage corresponding to an output current of the fuel cell stack 10 is lower than a predetermined reference voltage V1 at Step S12.

Next, the controller 13 may instruct the impedance meter 12 to measure impedance (high frequency impedance and low frequency impedance) of the fuel cell stack 10 when the output voltage is lower than the predetermined reference voltage V1 and receive high frequency impedance and low frequency impedance measured by the impedance meter 12 at Step S13.

Next, the controller 13 may compare the high frequency impedance and the low frequency impedance measured by the impedance meter 12 with a predetermined first critical point Z1 and a predetermined second critical point Z2 at Step S14 and Step S15. The controller 13 may increase an amount of fuel or oxidizer supplied to the fuel cell stack 10 to increase the output voltage of the fuel cell stack 10 when the high frequency impedance is lower than the first critical point Z1 and when the low frequency impedance is higher than the second critical point Z2 at Step S15. To this end, the controller 13 may open a purging valve 15 on a remaining-hydrogen recovery line to increase an amount of hydrogen that is fuel of a fuel cell system or may increase an operation amount of a circulation pump 16 that returns remaining hydrogen to the fuel cell stack 10. In addition, the controller 13 may increase an operation amount of an air blower 17 (an air supply unit) to increase an amount of air (oxidizer) supplied to the fuel cell stack 10.

The controller 13 may instruct again the impedance meter 12 to measure low frequency impedance of the fuel cell stack after a predetermined period of time has elapsed at Step S17 and may compare the low frequency impedance remeasured by the impedance meter 12 with the second critical point Z2 at Step S18.

When the comparison result of Step S18 shows that the low frequency impedance of the fuel cell stack 10 has not decreased but still remains higher than the second critical point Z2, the controller 13 may determine that a decrease in the output voltage of the fuel cell stack is attributable to contamination of the fuel cell stack 10.

This determination of the controller 13 may be based on a link between characteristics of high frequency impedance and low frequency impedance of a fuel cell stack and contamination of a fuel cell stack.

Figure 4A:
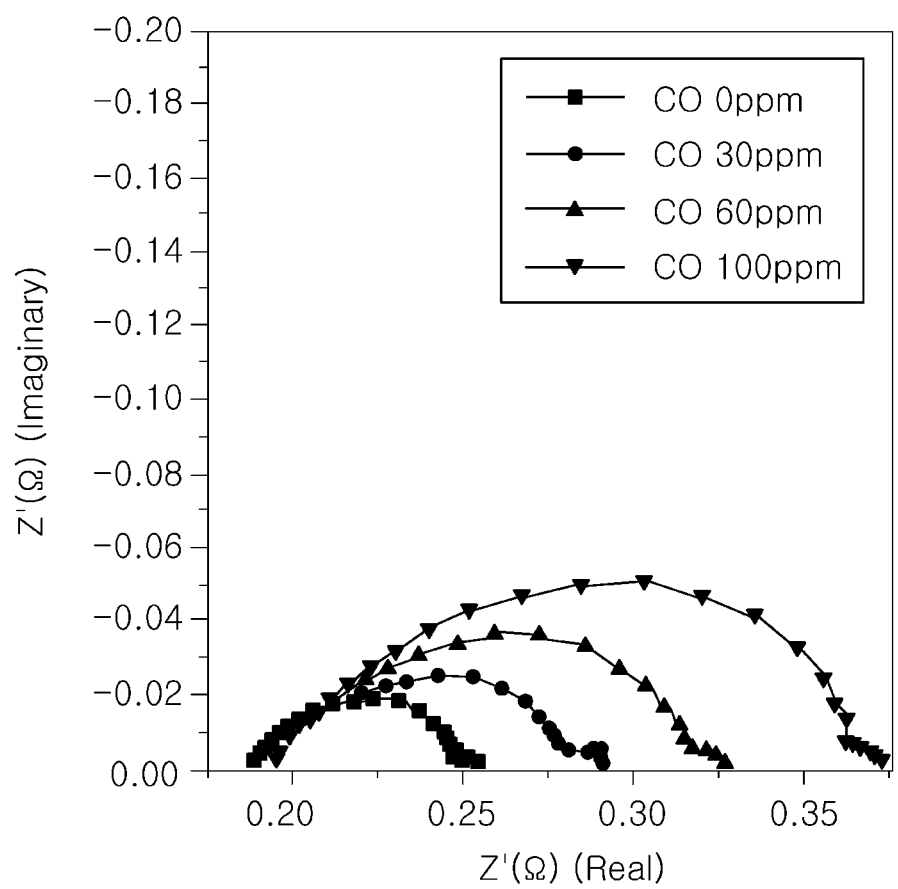
FIGS. 4A and 4B are graphs illustrating measurements of impedance of a fuel cell stack having a catalyst layer that is contaminated.
Figure 4B:
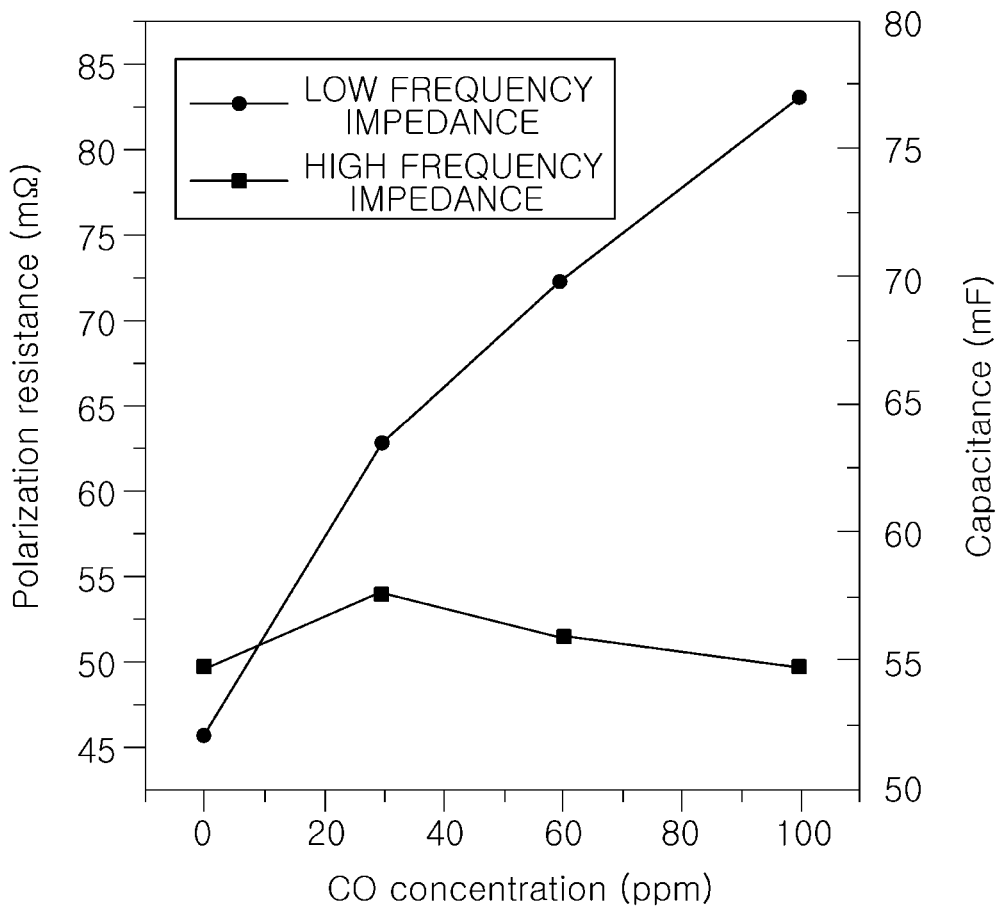
Figure 5:
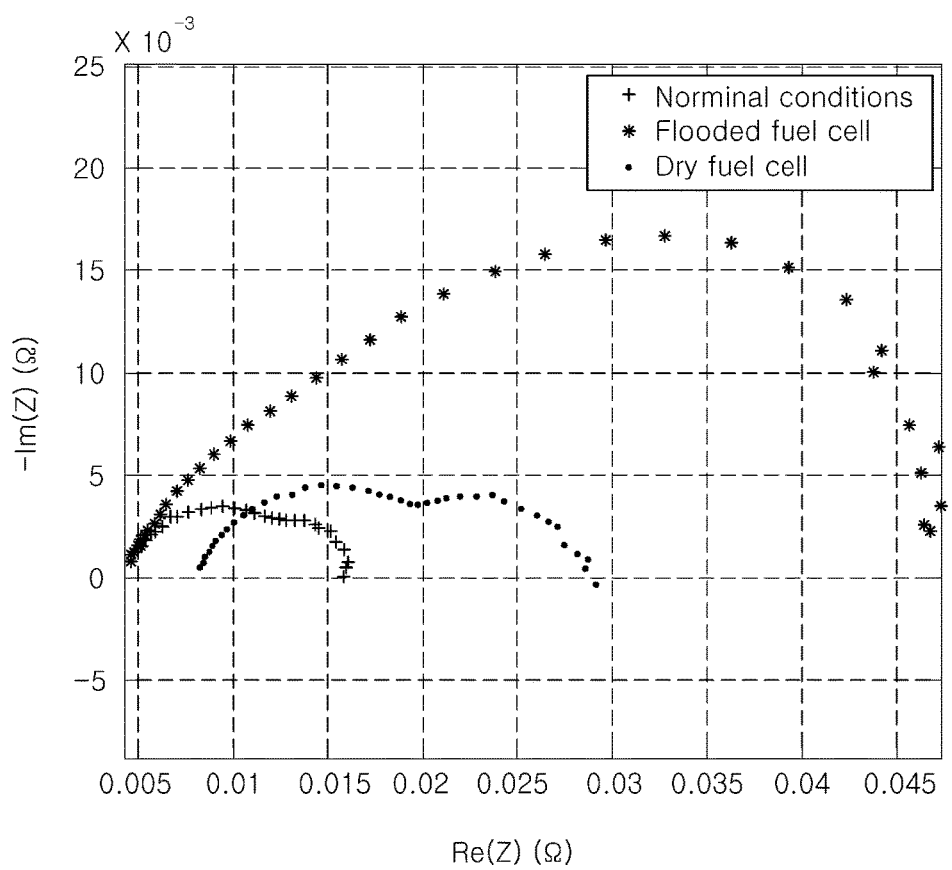
FIG. 5 is a graph illustrating measurements of impedance of a fuel cell stack according to humidity in a fuel cell stack.

FIGS. 4A and 4B illustrate measurements of impedance of a fuel cell stack when a catalyst layer of a fuel cell stack is contaminated, and FIG. 5 illustrates measurements of impedance of a fuel cell stack according to humidity in a fuel cell stack.

Specifically, FIGS. 4A and 4B illustrate changes in impedance of a fuel cell stack according to degrees of CO contamination of a catalyst layer of a fuel cell stack. As illustrated in FIGS. 4A and 4B, when a catalyst layer of a fuel cell stack is severely contaminated, the low frequency impedance may be increased. However, the high frequency impedance may not change according to degrees of contamination of a catalyst layer.

With reference to FIG. 5, it is found that the low frequency impedance may dramatically increase as the degree of flooding in a fuel cell stack is intensified.

With reference to FIGS. 4A, 4B and 5, as the contamination or flooding is aggravated, the low frequency impedance may be increased. The contamination problem of a fuel cell stack cannot be solved by a measure of supplying fuel or oxidizer, but the flooding problem may be solved by a measure of increasing an amount of fuel or oxidizer supplied to the fuel cell stack because the supplied fuel or oxidizer removes water or moisture. Therefore, according to an embodiment of the present disclosure, when low frequency impedance of a fuel cell stack is higher than a predetermined level, the controller 13 may perform an operation control of supplying more fuel or oxidizer to solve the flooding problem at Step S16. That is, the controller 113 may increase supply of hydrogen or air. If the low frequency impedance of the fuel cell stack 10 is decreased as the result of the operation control, the state of the fuel cell stack 10 may be diagnosed as being contaminated at Step S181. However, if the low frequency impedance of the fuel cell stack 10 still remains high even after the operation control of the controller 13, the state of the fuel cell stack 10 may be diagnosed as being contaminated at Step S19.

FIG. 3 illustrates a method for diagnosing a state of a fuel cell stack as being contaminated according to another embodiment.

The embodiment of FIG. 3 is substantially the same as the embodiment of FIG. 2 in terms of steps S11 to S16 but is different in that the controller 13 may diagnose a state of the fuel cell stack 10 using a detection result of an output voltage of the fuel cell stack 10 after performing an operation control of increasing an output voltage of the fuel cell stack 10 at Step S16.

According to the embodiment of FIG. 3, when a predetermined period of time is elapsed after the operation control of increasing the output voltage of the fuel cell stack 10 (Step S16), the controller 13 may compare the output voltage of the fuel cell stack 10, which is sent from the voltmeter 11, with a predetermined critical level at Step S21 and S22 and may diagnose a state of the fuel cell stack 10 as being contaminated if the output voltage of the fuel cell stack 10 is not increased to exceed the critical level at Step S23. This is based on the idea that the degree of flooding may be eased and the output voltage of the fuel cell stack 10 may be increased through the operation control of Step S16 if the decrease in the output voltage of the fuel cell stack 10 is attributable to flooding in the fuel cell stack 10. Therefore, when the output voltage of the fuel cell stack 10 is increased to exceed the predetermined critical level at Step S18, the controller 13 may determine that the decrease in the output voltage of the fuel cell stack 10 is attributable to the flooding.

In the embodiments of FIGS. 2 and 3, when the high frequency impedance is determined to be higher than the first critical point Z1 at Step S14, the controller 13 may determine that the fuel cell stack 10 is dried out (Step S141). When the high frequency impedance is determined to be lower than the first critical point Z1 (S14) and the low frequency impedance is determined to be lower than the second critical point Z2 (S15), the controller 13 may determine that the fuel cell stack 10 is normal at Step S151.

The diagnosing method and system according to the embodiments of the present disclosure can precisely and accurately determine the cause of deterioration in the performance of a fuel cell stack and thus enable appropriate measures to be taken to solve the problems.

The present disclosure prevents a fuel cell stack from suffering problems resulting from inappropriate measures that may be taken when an inaccurate diagnosis is made on a state of a fuel cell stack. For example, when a false diagnosis is made such that deterioration in the performance of a fuel cell stack is attributable to drying of the fuel cell stack although the actual cause of the deterioration is flooding, an operation control of decreasing an air flow rate is performed and thus stability and durability of the fuel cell stack is deteriorated. The present disclosure can prevent such a false diagnosis, thereby preventing the stability and durability of the fuel cell stack from deteriorating. Conversely, when a false diagnosis is made such that deterioration in the performance of a fuel cell stack is attributable to flooding in the fuel cell stack although the actual cause of the deterioration is drying, an operation control of increasing an air flow rate is performed and thus the performance of the fuel cell stack is continuously deteriorated. The present disclosure prevents such a false diagnosis, thereby preventing the performance of the fuel cell stack from continuous deterioration.

Although embodiments of the present disclosure have been described for illustrative purposes, those skilled in the art will appreciate that various modifications, additions and substitutions are possible, without departing from the scope and spirit of the disclosure as disclosed in the accompanying claims.

What is claimed is:

1. A method for diagnosing a state of a fuel cell stack as being contaminated, comprising:
   measuring an impedance of a fuel cell stack at a predetermined low frequency and a predetermined high frequency;
   increasing an amount of fuel or oxidizer supplied to the fuel cell stack when the impedance at the predetermined high frequency is lower than a first critical point and the impedance at the predetermined low frequency is higher than a second critical point;
   remeasuring the impedance of the fuel cell stack at the predetermined low frequency; and
   determining that the fuel cell stack is contaminated when the impedance at the predetermined low frequency that is measured in the remeasuring step is higher than the second critical point.

2. The method according to claim 1, further comprising:
   determining that the fuel cell stack is dried out when the impedance at the predetermined high frequency that is measured in the measuring step is higher than the first critical point.

3. The method according to claim 1, further comprising:
   determining that the fuel cell stack is normal when the impedance at the predetermined high frequency that is measured in the measuring step is lower than the first critical point and the impedance at the predetermined low frequency that is measured in the measuring step is lower than the second critical point.

4. The method according to claim 1, further comprising:
   determining that the fuel cell stack is flooded when the impedance at the predetermined low frequency that is measured in the remeasuring step is lower than the second critical point.

5. A method for diagnosing a state of a fuel cell stack as being contaminated, comprising:
   measuring an impedance of a fuel cell stack at a predetermined low frequency and a predetermined high frequency;
   increasing an amount of fuel or oxidizer supplied to the fuel cell stack when the impedance at the predetermined high frequency that is measured in the measuring step of the impedance is lower than a first critical point and the impedance at the predetermined low frequency that is measured in the measuring step of the impedance is higher than a second critical point;
   measuring an output voltage of the fuel cell stack; and
   determining that the fuel cell stack is contaminated when the output voltage measured in the measuring step of the output voltage is not increased from an output voltage of the fuel cell stack that is output immediately before the measuring of the impedance is performed, by a predetermined critical voltage level.

6. The method according to claim 5, further comprising:
   determining that the fuel cell stack is dried out when the impedance at the predetermined high frequency that is measured in the measuring step of the impedance is higher than the first critical point.

7. The method according to claim 5, further comprising:
   determining that the fuel cell stack is normal when the impedance at the predetermined high frequency that is measured in the measuring step of the impedance is lower than the first critical point and the impedance at the predetermined low frequency that is measured in the measuring step of the impedance is lower than the second critical point.

8. The method according to claim 5, further comprising:
   determining that the fuel cell stack is flooded when the output voltage that is measured in the measuring step of the output voltage is increased from the output voltage of the fuel cell stack that is output immediately before the measuring step of the impedance is performed, by the predetermined critical voltage level.

9. A system for diagnosing a state of a fuel cell stack as being contaminated, the system comprising:
   an impedance meter that measures an impedance of a fuel cell stack at a predetermined high frequency and a predetermined low frequency; and
   a controller that diagnoses a state of the fuel cell stack according to the impedance of the fuel cell stack at the predetermined high frequency and the impedance of the fuel cell stack at the predetermined low frequency, the impedances being measured by the impedance meter,
   wherein the controller receives the impedance at the predetermined high frequency and the impedance at the predetermined low frequency, the impedances being measured by the impedance meter,
   wherein the controller performs an operation control of increasing an amount of fuel or oxidizer supplied to the fuel cell stack when the impedance at the predetermined high frequency is lower than a first critical point and the impedance at the predetermined low frequency is higher than a second critical point,
   wherein the controller receives the impedance of the fuel cell stack at the predetermined low frequency after performing the operation control of increasing the amount of fuel or oxidizer supplied to the fuel cell stack, and
   wherein the controller determines that the fuel cell stack is contaminated when the remeasured impedance at the predetermined low frequency is higher than the second critical point.

10. A system for diagnosing a state of a fuel cell stack as being contaminated, the system comprising:
    an impedance meter for measuring an impedance of a fuel cell stack at a predetermined high frequency and a predetermined low frequency; and
    a controller for diagnosing a state of the fuel cell stack according to the impedance at the predetermined high frequency and the impedance at the predetermined low frequency,
    wherein the controller receives the impedance at the predetermined high frequency and the impedance at the predetermined low frequency, the impedances being measured by the impedance meter,
    wherein the controller performs an operation control of increasing an amount of fuel or oxidizer supplied to the fuel cell stack when the impedance at the predetermined high frequency is lower than a first critical point and the impedance at the predetermined low frequency is higher than a second critical point,
    wherein the controller receives an output voltage of the fuel cell stack measured by a voltmeter after performing the operation control of increasing the amount of fuel or oxidizer supplied to the fuel cell stack, and
    wherein the controller determines that the fuel cell stack is contaminated when the output voltage measured is not increased by a predetermined critical voltage level from an output voltage of the fuel cell stack that is measured by the voltmeter immediately before the impedance at the predetermined high frequency and the impedance at the predetermined low frequency are measured.

* * * * *